US011056203B1

(12) United States Patent
Yang et al.

(10) Patent No.: US 11,056,203 B1
(45) Date of Patent: Jul. 6, 2021

(54) BOOSTED BITLINES FOR STORAGE CELL PROGRAMMED STATE VERIFICATION IN A MEMORY ARRAY

(71) Applicant: INTEL CORPORATION, Santa Clara, CA (US)

(72) Inventors: Xiang Yang, Santa Clara, CA (US); Pranav Kalavade, San Jose, CA (US); Ali Khakifirooz, Los Altos, CA (US); Shantanu R. Rajwade, Santa Clara, CA (US); Sagar Upadhyay, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/788,194

(22) Filed: Feb. 11, 2020

(51) Int. Cl.
 *G11C 16/34* (2006.01)
 *G11C 16/04* (2006.01)
 *G11C 16/10* (2006.01)
 *G11C 16/24* (2006.01)
 *G11C 11/56* (2006.01)

(52) U.S. Cl.
 CPC ...... *G11C 16/3459* (2013.01); *G11C 11/5671* (2013.01); *G11C 16/0483* (2013.01); *G11C 16/10* (2013.01); *G11C 16/24* (2013.01)

(58) Field of Classification Search
 CPC ..... G11C 16/3459; G11C 16/10; G11C 16/24; G11C 16/0483; G11C 11/5671
 See application file for complete search history.

(56) References Cited

U.S. PATENT DOCUMENTS

| 9,424,936 | B1 | 8/2016 | Tanzawa et al. | |
|---|---|---|---|---|
| 2007/0201278 | A1* | 8/2007 | Devin | G11C 16/3454 365/185.22 |
| 2014/0215128 | A1* | 7/2014 | Chin | G06F 12/0246 711/103 |
| 2014/0281842 | A1* | 9/2014 | Wood | G11C 16/10 714/799 |
| 2015/0131380 | A1* | 5/2015 | Chin | G06F 12/0246 365/185.12 |

OTHER PUBLICATIONS

Wikipedia, "Flash Memory", [online], last modified Dec. 4, 2019, [Retrieved on Dec. 12, 2019], retrieved from the Internet at <URL: https://en.wikipedia.org/wiki/Flash_memory#NAND_flash>, 34 pp.
Patent Application U.S. Appl. No. 16/396,478, dated Apr. 26, 2019, 30 pp.

* cited by examiner

*Primary Examiner* — Gene N Auduong
(74) *Attorney, Agent, or Firm* — Compass IP Law PC

(57) ABSTRACT

In one aspect of programmed state verification in accordance with the present description, the voltage levels on bitlines of non-target storage cells are each boosted by applying a non-zero offset or delta value, $\Delta V$, to the bitlines of non-target storage cells during a precharge subinterval. A bitline verification voltage applied to a bitline of a target storage cell causes the voltage of the bitline to ramp up from the boosted $\Delta V$ value. As a result, starting from an initial value which is the higher or boosted $\Delta V$ value, the bitline voltage ramps up more quickly during the precharge subinterval to the bitline verification voltage level to improve system performance. In addition, the bitline verification voltage applied to bitlines of target storage cells during the precharge subinterval, can be at a relatively high value to maintain the accuracy of program state verification.

24 Claims, 7 Drawing Sheets

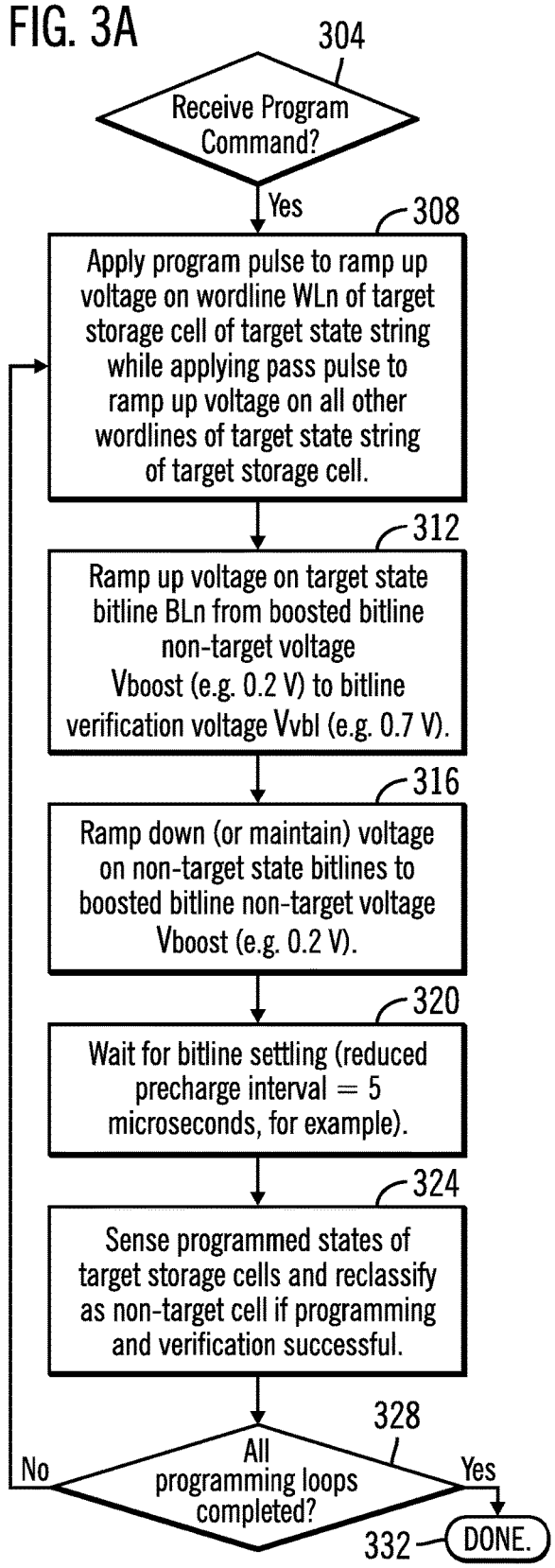
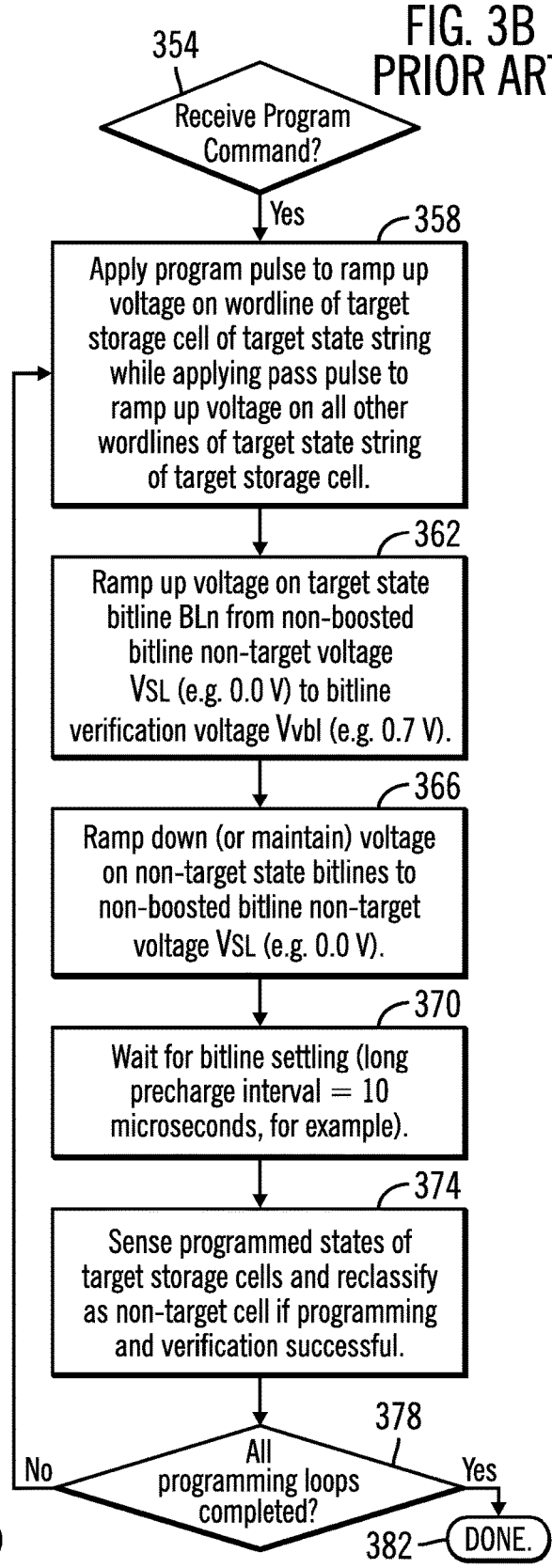

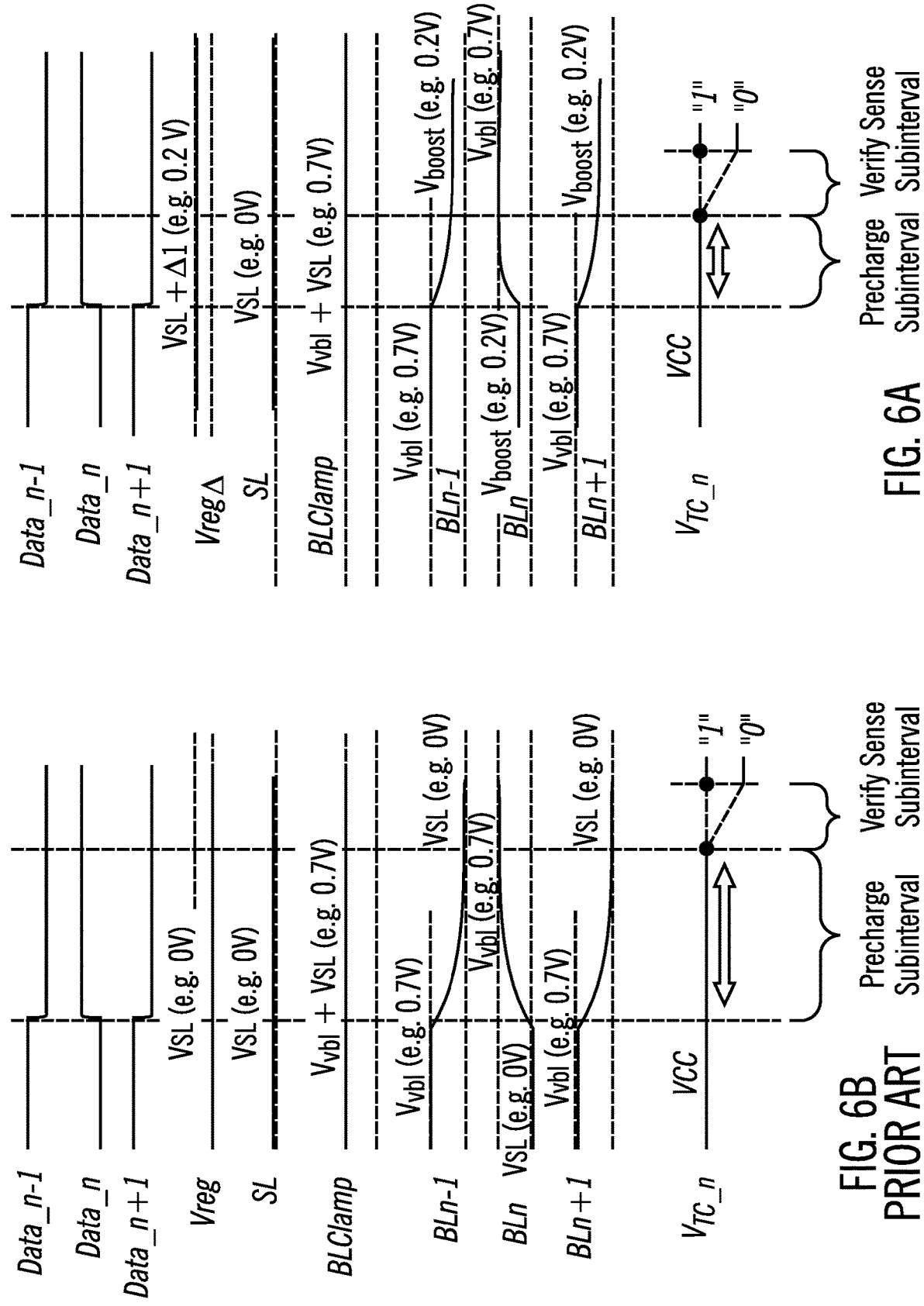

BOOSTED BITLINES FOR STORAGE CELL PROGRAMMED STATE VERIFICATION IN A MEMORY ARRAY

TECHNICAL FIELD

Embodiments described herein generally relate to an apparatus, non-volatile memory storage device and method for boosting bitline voltages for storage cell programmed state verification in a memory array.

BACKGROUND

Solid state storage devices (for example, solid state drives or SSDs) may be comprised of one or more packages of non-volatile memory dies implementing NAND memory cells, for example, where each die is comprised of storage cells, and where storage cells are organized into pages and pages are organized into blocks. Each storage cell can store one or more bits of information. The different cells may be programmed to one or more programmed states representing data, by applying a series of pulses to have selected cells reach a desired voltage threshold level.

In NAND memory arrays, storage cells of the array are frequently arranged in strings of storage cells in which a bitline is coupled to one end of each string and a word line is coupled to each storage cell of the string. The storage cells of the strings are programmed in a sequence of programming intervals. In each programming interval, a programming pulse is applied to selected memory cells referred to herein as target storage cells, to inject an amount of charges in the targeted memory cells. Each programming interval also includes a verify operation following the programming pulse, which determines whether a targeted storage cell has trapped the desired amount of charges. Once a targeted storage cell has passed the verify operation confirming the desired programming level for that cell, that cell is reclassified as a non-target storage cells and is no longer targeted for additional programming pulses or verify operations. In this manner, non-target storage cells are inhibited from receiving additional charge injections in subsequent programming intervals.

BRIEF DESCRIPTION OF THE DRAWINGS

Embodiments are described by way of example, with reference to the accompanying drawings, which are not drawn to scale, in which like reference numerals refer to similar elements.

FIG. 3A illustrates an embodiment of operations employing boosted bitline voltages for program state verification in accordance with the present description.

FIG. 3B illustrates an embodiment of operations for programming and verification in a known device.

FIG. 6A illustrates a timing diagram and associated voltage changes in a precharge subinterval employing boosted bitline voltages for program state verification in accordance with the present description.

FIG. 6B illustrates a timing diagraph and associated voltage changes in a known precharge subinterval.

DESCRIPTION OF EMBODIMENTS

Figure 1:
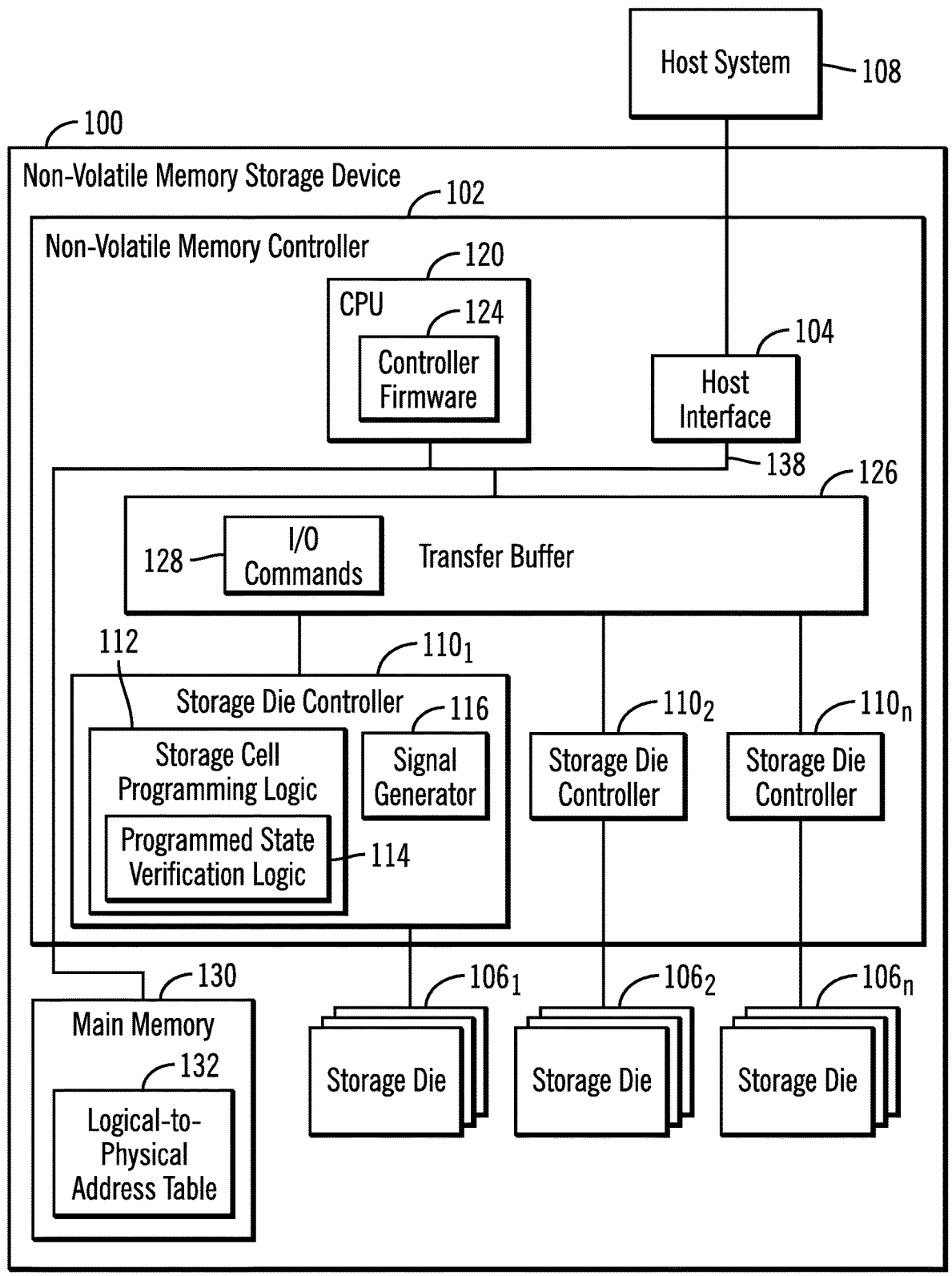
FIG. 1 illustrates an embodiment of a system which includes a non-volatile memory storage device employing boosted bitline voltages for program state verification in accordance with the present description.

In known storage cell arrays, the verify operation following the programming pulse in each programming interval includes a precharge subinterval in which a bitline verification voltage is applied to ramp up the voltage on a bitline of the target storage cell to settle at the bitline verification voltage in preparation for program state verification. This bitline verification voltage provides a string current through the string of storage cells for that bitline, for sensing of programmed states of target cells of the string of storage cells. Conversely, if the storage cell is a non-target storage cell, the associated bitline of the non-target storage cell is ramped down during the precharge subinterval to the level of the associated string source (typically ground) in known storage cell arrays. Thus, if a storage cell was previously selected or classified as a non-target storage cell in a previous programming interval, but has been reclassified as a target storage cell in a subsequent programming interval, the bitline verification voltage applied to the bitline of the target storage cell causes the voltage of the bitline to ramp up from the string source (ground) level associated with a non-target bitcell, to the applied bitline verification voltage associated with a target bitcell, for programmed state sensing. By comparison, if a storage cell was previously classified as a target storage cell in a previous programming interval, but has been reclassified as a non-target storage cell in a subsequent programming interval, the grounded signal applied to the bitline of the non-target bitcell causes the voltage of the bitline to ramp down from the bitline verification voltage associated with a target bitcell, to the ground (or string source) level associated with a non-target bitcell.

It is appreciated herein that the ramping up and down of voltages on adjacent bitlines activates strong bitline-to-bitline capacitive coupling which can significantly slow down the ramping up and settling of voltages at the level of the bitline verification voltage for target storage bitcells during the precharge subinterval of each programming interval. Accordingly, the precharge subinterval is preferably of sufficient duration to allow the bitline voltage level to fully ramp up and settle at the bitline verification voltage before initiating actual programmed state sensing to ensure proper sensing of the programmed state. In addition, a longer precharge subinterval can reduce peak currents caused by the bitline-to-bitline capacitive coupling. However, the longer the precharge interval, the longer the duration of each programming interval which likely reduces performance of the storage array.

To reduce the bitline ramp up and settling time and thus to reduce the duration of the precharge interval, one known approach is to reduce the level of the bitline verification voltage for target storage cells, to reduce the time needed for the bitline voltage level to ramp up from ground to such a lower bitline verification voltage level. For example, one known bitline verification voltage for target storage cells is 0.7 v and it has been proposed to reduce the bitline verification voltage level to a lower level such as 0.5 v, or 0.3 v, for example. However, it is appreciated that reducing the level of the bitline verification voltage may reduce the string current through the associated string of storage cells to a level which impairs accurate programmed state sensing. As a result, inaccurate sensing of programmed states in storage cells can lead to over programming or under programming of such storage cells in subsequent programming intervals.

Another approach to improving performance of the storage array is to reduce the duration of the precharge subinterval which can shorten the duration of the overall programming interval. However, if the precharge subinterval is terminated before the bitline voltages of target storage cells have had sufficient opportunity to ramp up and settle at the correct bitline verification voltage level, accurate sensing of programmed states may again be impaired. In addition, peak currents may be increased by shortening the duration of the precharge subinterval.

Thus, to reduce bitline settling time and improve performance, it has been proposed to reduce the level of the bitline verification voltage. However, to ensure proper programmed state sensing, a high bitline verification voltage has been needed to provide sufficient string current for accurate sensing of programmed states. Thus, it is difficult to achieve improved performance without sacrificing accuracy in programmed state sensing.

In one aspect of programmed state verification in accordance with the present description, the voltage levels on bitlines of non-target storage cells are each boosted by applying a non-zero offset or delta value, $\Delta V$, to the bitlines of non-target storage cells during the precharge subinterval, as compared to the string source line voltage level which is typically ground in many known storage arrays. In addition, the bitline verification voltage applied to bitlines of target storage cells during the precharge subinterval, can remain at a relatively high value, such as 0.7 v, for example, to maintain the accuracy of program state verification. In one embodiment, the voltage level on bitlines of non-target storage cells is boosted by a non-zero offset value, $\Delta V$, equal to 0.2 v, for example, while maintaining the bitline verification voltage applied to bitlines of target storage cells at a relatively high value, such as 0.7 v, for example. It is appreciated that other voltage levels may be selected, depending upon the particular application.

As explained in greater detail below, by boosting the voltage level on bitlines of non-target storage cells by applying a non-zero offset or delta value, $\Delta V$, if a storage cell was previously a non-target storage cell in a previous programming interval, but has been reclassified as a target storage cell in a subsequent programming interval, the bitline verification voltage applied to the bitline of the target storage cell causes the voltage of the bitline to ramp up from the boosted $\Delta V$ value instead of the ground or string source line level associated with a known non-target bitcell. Thus, the voltage of the bitline of the target storage cells ramps up from the boosted $\Delta V$ value, to the applied bitline verification voltage associated with a target bitcell, for programmed state sensing. As a result, starting from an initial value which is the higher or boosted $\Delta V$ value, the bitline voltage ramps up more quickly during the precharge subinterval to the bitline verification voltage level notwithstanding that the level of the bitline verification voltage need not have changed but instead may remain at a high level to provide a high level of string current for accurate programmed state sensing.

Because the bitline voltage ramps up more quickly to the high bitline verification voltage level, the duration of the precharge subinterval may be safely shortened yet still provide sufficient opportunity for the voltage level of the target storage cell bitline to ramp up and settle at a high bitline verification voltage level which has not been reduced. As a result, performance of the storage array may be improved by shortening the duration of the overall programming interval without reducing the string current through the associated string of storage cells and without impairing the accuracy of programmed state sensing. Thus, the precharge subinterval although shortened, will not be terminated before the bitline voltages of target storage cells have had sufficient opportunity to ramp up and settle at the correct bitline verification voltage level. In addition, by starting from an initial value which is the higher or boosted $\Delta V$ value, the magnitude of the bitline voltage ramp up to the bitline verification voltage level is reduced notwithstanding that the level of the bitline verification voltage has not changed and remains at a high level. As a result, peak currents during the ramp up may be reduced as well.

In this manner, boosted bitline voltages for programmed state verification in accordance with the present description, provides a significant improvement in computer technology. Other aspects and advantages may be achieved, depending upon the particular application.

In the following description, numerous specific details such as logic implementations, opcodes, means to specify operands, resource partitioning/sharing/duplication implementations, types and interrelationships of system components, and logic partitioning/integration choices are set forth in order to provide a more thorough understanding of the present invention. It will be appreciated, however, by one skilled in the art that the invention may be practiced without such specific details. In other instances, control structures, gate level circuits and full software instruction sequences have not been shown in detail in order not to obscure the invention. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Certain embodiments relate to storage device electronic assemblies. Embodiments include both devices and methods for forming electronic assemblies.

Implementations of the described techniques may include hardware, a method or process, or computer software such an application, operating system, BIOS, or component driver on a computer-accessible medium. Thus, embodiments include corresponding computer systems, apparatus, and computer programs recorded on one or more computer storage devices, each configured to perform the actions of the methods.

Operations described herein are performed by logic or logic means, which is configured to perform the operations either automatically or substantially automatically with little or no system operator intervention, except where indicated as being performed manually such as user selection. Thus, as used herein, the term "automatic" includes both fully automatic, that is operations performed by one or more hardware or software controlled machines with no human intervention such as user inputs to a graphical user selection interface. As used herein, the term "automatic" further includes predominantly automatic, that is, most of the operations (such as greater than 50%, for example) are performed by one or more hardware or software controlled machines with no human intervention such as user inputs to a graphical user selection interface, and the remainder of the operations (less than 50%, for example) are performed manually, that is, the manual operations are performed by one or more hardware or software controlled machines with human intervention such as user inputs to a graphical user selection interface to direct the performance of the operations.

Many of the functional elements described in this specification have been labeled as "logic," in order to more particularly emphasize their implementation independence. For example, a logic element may be implemented as a hardware circuit comprising custom Very Large Scale Integrated (VLSI) circuits or gate arrays, off-the-shelf semiconductors such as logic chips, transistors, or other discrete components. A logic element may also be implemented in firmware or programmable hardware devices such as field programmable gate arrays, programmable array logic, programmable logic devices or the like.

A logic element may also be implemented in software for execution by various types of processors. A logic element which includes executable code may, for instance, comprise one or more physical or logical blocks of computer instructions which may, for instance, be organized as an object, procedure, or function. Nevertheless, the executables of an identified logic element need not be physically located together, but may comprise disparate instructions stored in different locations which, when joined logically together, comprise the logic element and achieve the stated purpose for the logic element.

Indeed, executable code for a logic element may be a single instruction, or many instructions, and may even be distributed over several different code segments, among different programs, among different processors, and across several non-volatile memory devices. Similarly, operational data may be identified and illustrated herein within logic elements, and may be embodied in any suitable form and organized within any suitable type of data structure. The operational data may be collected as a single data set, or may be distributed over different locations including over different storage devices.

FIG. 1 illustrates an embodiment of a non-volatile memory storage device 100 having a non-volatile memory controller 102, including a host interface 104 to transfer blocks of data and I/O commands between a plurality of groups of storage dies $106_1$, $106_2$ ... $106_n$, comprising a non-volatile memory of storage cells that may be organized into pages of storage cells, where the pages are organized into blocks, and a connected host system 108. The non-volatile memory storage device 100 includes storage die controllers $110_1$, $110_2$ ... $110_n$ that manage read and write requests to blocks of data in pages of storage cells to groups of the storage dies $106_1$, $106_2$ ... $106_n$ and the transfer of data between the transfer buffer 126 and the storage dies $106_1$, $106_2$ ... $106_n$. The storage die controllers $110_1$, $110_2$ ... $110_n$ may include, as shown with respect to storage die controller $110_1$, storage cell programming logic 112 which is configured to program storage cells of the storage dies $106_1$, $106_2$ ... $106_n$ in a sequence of programming intervals. In each programming interval, a programming pulse is applied to selected memory cells referred to herein as target storage cells, to inject an amount of charges in the targeted memory cells.

The storage cell programming logic 112 of each storage die controller $110_1$, $110_2$ ... $10_{n\,further}$ includes programmed state verification logic 114 which is configured to verify the programmed state of each storage cell which has been programmed. Thus, in this embodiment, each programming interval includes a verify operation following the programming pulse, which determines whether a targeted storage cell has trapped the desired amount of charges. Once a targeted storage cell has passed the verify operation confirming the desired programming level for that cell, that cell is reclassified by the storage cell programming logic 112 as a non-target storage cells and is no longer targeted for additional programming pulses or verification operations. In this manner, non-target storage cells are inhibited from receiving additional charge injections in subsequent programming intervals. Logic components described herein may be configured using one or more of hardware, software, and firmware, alone or in combination.

In one aspect of the present description, the programmed state verification logic 114 is configured to boost voltage levels on bitlines of non-target storage cells by applying a non-zero offset or delta value, $\Delta V$, to the bitlines of storage cells. As explained in greater detail below, by starting from an initial value which is the higher or boosted $\Delta V$ value, the bitline voltage can ramp up more quickly to the bitline verification voltage level, thereby reducing settling times. As a result, the duration of a precharge subinterval of the programming interval may be reduced providing a significant improvement in device performance. Moreover, this performance improvement may be achieved without reducing the bitline verification voltage so as to maintain accuracy of programmed state sensing.

Each storage die controller of the controllers $110_1$, $110_2$ ... $110_n$, further includes a signal generator 116 which generates appropriate data, address, control and supply signals to the associated storage dies $106_1$, $106_2$ ... $106_n$ for read operations and for write operations including programming and verification of programmed states of the storage cells of the storage dies $106_1$, $106_2$ ... $106_n$. For example, each storage die controller may cause its associated signal generator 116 to generate appropriate voltage or current signals for use during memory operations by being applied to control lines, wordlines, bitlines, and other components, such as select gate drain (SGD) devices, and select gate source (SGS) devices, during read or write operations to access memory cells, to perform programmed state verification operations to prepare the memory array for a next round of pulses of program voltages to further program selected memory cells to a next program level.

The non-volatile memory storage device 100 may function as both a memory device and/or a storage device (for example, a Solid State Drive (SSD)) in a computing system, and may be used to perform the role of volatile memory devices and non-volatile storage media in a computing system. In an embodiment, the non-volatile memory storage device 100 may comprise a non-volatile memory storage device.

The non-volatile memory controller 102 may include a central processing unit (CPU) 120 implementing controller firmware 124, also referred to as a memory controller, managing the operations of the non-volatile memory storage device 100 and a non-volatile transfer buffer 126 comprising a non-volatile memory device to cache and buffer transferred Input/Output ("I/O") commands 128 and data between the host 108 and storage dies $106_1$, $106_2$ ... $106_n$. The transfer buffer 126 may comprise a Static Random Access Memory (SRAM) or other suitable volatile or non-volatile memory storage device.

A main memory 130 stores a logical-to-physical address table 132 providing a mapping of logical addresses to which I/O requests are directed and physical addresses in the storage dies $106_1$, $106_2$ ... $106_n$ at which the data for the logical addresses are stored The logical addresses may comprise logical block address (LBAs) or other logical addresses known in the art.

In one embodiment, the memory device, such as including the storage dies $106_1$, $106_2$ ... $106_n$, transfer buffer 126, and main memory 130, may comprise a block addressable memory device, such as those based on NAND or NOR technologies. A memory device may also include future generation nonvolatile devices, such as a three dimensional crosspoint (3D crosspoint) memory device, or other byte addressable write-in-place nonvolatile memory devices. In some embodiments, 3D crosspoint memory may comprise a transistor-less stackable cross point architecture in which memory cells sit at the intersection of wordlines and bitlines and are individually addressable and in which bit storage is based on a change in bulk resistance. In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory. The memory device may refer to the die itself and/or to a packaged memory product. The storage dies $106_1$, $106_2$ ... $106_n$, transfer buffer 126, and main memory 130 may comprise different types of memory devices. The transfer buffer 126 may comprise an SRAM; and the main memory 130 may comprise a Dynamic Random Access Memory (DRAM), which may be battery backed-up, or a 3D crosspoint memory. In certain embodiments, the main memory 130 may comprise a non-volatile memory storage device 100 of the described embodiments within another non-volatile memory storage device 100.

The host interface 104 connects the non-volatile memory storage device 100 to a host system 108. The non-volatile memory storage device 100 may be installed or embedded within the host system 108, or the non-volatile memory storage device 100 may be external to the host system. The host interface 104 may comprise a bus interface, such as a Peripheral Component Interconnect Express (PCIe) interface, Serial AT Attachment (SATA), Non-Volatile Memory Express (NVMe), etc.

The CPU 120, host interface 104, and transfer buffer 126 may communicate over one or more bus interfaces 138, such as a PCIe or other type of bus or interface. Data may be transferred among the host interface 104, CPU 120, and transfer buffer 126 over the bus 138 using Direct Memory Access (DMA) transfers, which bypass the CPU 120. Alternatively, the CPU 120 may be involved in transferring data among the host interface 104, transfer buffer 126, and storage dies $106_1$, $106_2$ ... $106_n$ over the bus 138. In FIG. 1, the connection between the units is shown as a bus 138. In alternative embodiments the connection among any of the components 104, 112, 116, and 120 may comprise direct lines or paths and not a shared bus.

Figure 2:
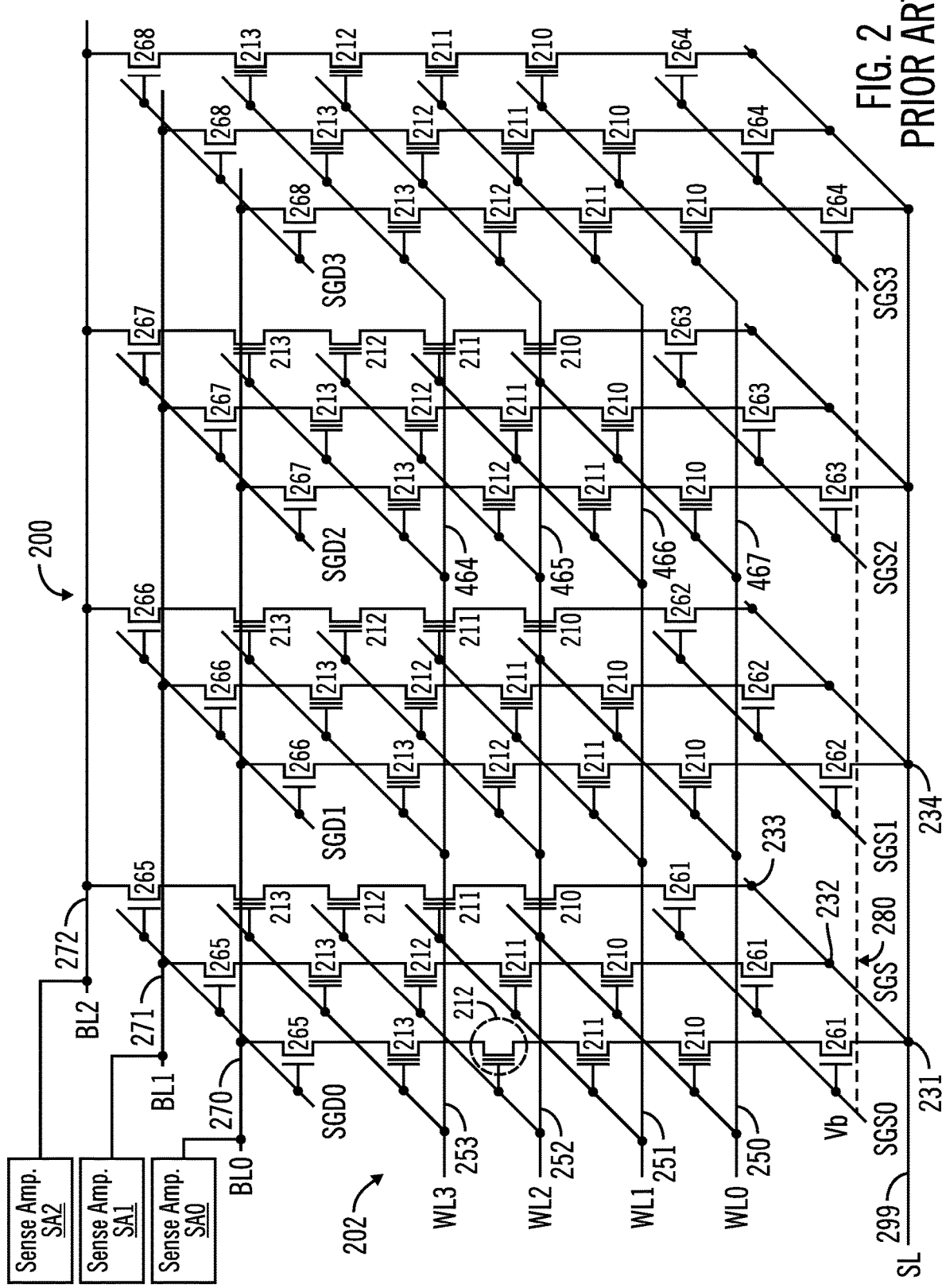
FIG. 2 illustrates an embodiment of a memory array of the storage device of FIG. 1.

FIG. 2 depicts an example of a known 3D memory array 200 of NAND type storage cells that may be implemented in the storage dies storage dies $106_1$, $106_2$ ... $106_n$, such that there may be one or more of the memory arrays 200 implemented in each of the storage dies $106_1$, $106_2$ ... $106_n$. The memory array may include wordlines 250, 251, 252, and 253 that carry corresponding signals WL0, WL1, WL2, and WL3, respectively, and bitlines 270, 271, and 272 that carry signals BL0, BL1, and BL2, respectively. Four wordlines 250, 251, 252, and 253 and three bitlines 270, 271, and 272 are shown in FIG. 2 as an illustrative example only. The number of these lines may vary. Memory device 200 may include memory cells 210, 211, 212, and 213, and transistors 261 through 268. The memory cells 210, 211, 212, and 213 and transistors 261 through 268 may be arranged in memory cell strings, such as memory cell strings (pillars) 231, 232, 233 and 234, for example. For simplicity, in FIG. 2, only four of the memory cell strings (pillars) are labeled (231, 232, 233 and 234). The memory array 200 shown in FIG. 2 depicts only twelve memory cell strings and four memory cells 210, 211, 212, and 213 in each memory cell string (pillar) for simplicity sake. The example memory array 200 shown in FIG. 2 is provided for illustrative purposes and is not limiting to this disclosure. One skilled in the art will appreciate that the number of access lines, number of memory cell strings (pillars), and number of memory cells in each memory cell string may vary.

Memory cells 210, 211, 212, and 213 may be physically located in multiple levels of the memory array 200, such that memory cells 210, 211, 212, and 213 in the same memory cell string may be stacked over each other in multiple levels of memory device 200, forming a pillar. As shown in FIG. 2, transistors 265 through 268 may be controlled (e.g., turned on or turned off) by corresponding signals SGD0, SGD1, SGD2, and SGD3, provided via corresponding lines as shown to couple the memory cell strings to their respective bitlines 270, 271, and 272 during a memory operation, such as a write operation. In a similar manner, transistors 261 through 264 may be controlled (e.g., turned on or turned off) by corresponding signals and SGS0, SGS1, SGS2, and SGS3, provided via corresponding lines as shown to couple the memory cell strings to a common source line 299 which carries the source line signal SL which is typically at ground level (0 v) in programmed state verification. In some embodiments, depending on a desired memory array 200 configuration, the lines carrying signals SGS0, SGS1, SGS2, and SGS3 may be connected via a common SGS line 280, as shown.

In a memory operation, such as a write operation, different voltages may be applied to word lines 250, 251, 252, and 253 by the signal generator 116 to selectively access memory cells 210, 211, 212, and 213 in order to store information into one or more selected memory cell among memory cells 210, 211, 212, and 213. For example, in a write operation, memory device 100 may select memory cell 212 (shown within a dashed circle) of memory cell string 231 to store information into memory cell 212. In this example, memory device 100 may apply a programming voltage to line 252 and other non-programming voltages to lines 250, 251, and 253. The voltage on lines 250, 251, and 253 may have the same or different values.

In embodiments, the memory array 200 may comprise one or more memory blocks disposed in the storage dies 106$_1$, 106$_2$ . . . 106$_n$. A memory block may have different memory capacities, depending on technological demand. For simplicity purposes, the memory array 200 illustrated in FIG. 2 illustrates a memory block that includes four sub-blocks defined respectively by SGD0, SGD1, SGD2, and SGD3. In operation, such as when a memory array is to be accessed for programming (or data reading), a memory block may be selected (e.g., for programming) or deselected, in order to refrain from programming while other block(s) are being programmed. Accordingly, in a memory array having a plurality of memory blocks, at least one block may be selected for access (e.g., for a program mode or read mode), while other blocks may be deselected in order to refrain from access. Selection and deselection of memory blocks may be accomplished by application of particular voltage values to respective wordlines and SGS lines.

In some examples, each memory cell 210, 211, 212, 213 can be targeted for programming according to various encoding schemes such as SLC (single level cell), MLC (multi-level cell) TLC (triple level cell), QLC (quad level cell), or other encoding scheme. Each cell's threshold voltage (Vt) is indicative of the programmed state and thus the data that is stored in the cell.

A programming sequence for a group of cells may include programming of all of the intended pages into the group of cells. A programming sequence may include one or more programming passes. A programming pass (which may include one or more programming loops) may program one or more pages. A programming pass may include the application of one or more effective program voltages to target cells to be programmed followed by the application of one or more verify voltages to these targeted cells in order to determine which cells have finished programming. Subsequent programming passes generally will not apply an effective program voltage and/or a verify voltage to the cells that have finished programming. Accordingly, cells that have finished programming and successful verification of programming, or cells that haven't finished programming but are classified to a different programmed state which is not being verified in current verification process, are referred to herein as non-target cells. In the illustrated embodiment, storage cell programming logic 112 is configured to classify storage cells of a memory array as one of target storage cells and non-target storage cells, depending upon whether the cells are to be programmed (target storage cells), or the cells have finished programming and successful verification of programming (non-target storage cells) or are otherwise not intended to be programmed (non-target storage cells).

The application of an effective program voltage to a target cell may include changing the voltage difference between a control gate and a channel of the cell in order to change the threshold voltage of the cell. Accordingly, a voltage of a wordline 250, 251, 252, 253 (coupled to the control gate of the target cell) and/or a channel of the target cell may be set in order to effectuate application of an effective program voltage. As a program voltage is commonly used to refer to a voltage applied to a wordline, the effective program voltage can be the voltage difference between a control gate and channel of a target cell (which in instances where the channel is held at 0 V can be synonymous with a program voltage).

In the illustrated embodiment, the verify operation following the programming pulse in a programming interval includes a precharge subinterval in which a bitline verification voltage ($V_{vbl}$) is applied to ramp up the voltage on the bitline of the string of storage cells which includes a target storage cell to settle at the bitline verification voltage. The bitline associated with a storage cell which is classified to current verification state but not yet successfully verified, is referred to herein as a target state bitline. The bitline verification voltage provides a string current through the string of storage cells for that target state bitline, and the string current is at a sufficiently high level for sensing of programmed states of target cells of the string of storage cells. Conversely, if the storage cell is a non-target storage cell or a target storage cell which is classified to a different verification state, the associated bitline of the string of non-target storage cells, is ramped down to (or maintained at) a boosted bitline non-target voltage ($V_{boost}$) which is sufficiently low to disable sensing of programmed states of cells of the string of non-target storage cells. The bitline associated with a non-target storage cell or a target storage cell which is classified to a different verification state is referred to herein as a non-target state bitline.

In one embodiment, the device 100 includes sense amplifiers SA0, SA1, SA2 (FIG. 2), which during the precharge interval, selectively apply to the bitlines 270, 271, 272, respectively, as bitline signals BL0, BL1, BL2, respectively, either the bitline verification voltage ($V_{vbl}$) if the bitline is a target state bitline, that is, associated with a string of storage cells which includes one or more target storage cells, or a bitline non-target voltage if the bitline is a non-target state bitline, that is, associated with a string of all non-target cells. In one aspect of boosted bitline program state verification in accordance with the present description, the sense amplifiers SA0, SA1, SA2, may receive a boosted supply voltage so as to apply a boosted bitline non-target voltage if the bitline is a non-target state bitline, in response to signals provided by the signal generator 116 (FIG. 1) of the associated storage die controller controlling the particular array 200. As a result, the duration of the precharge subinterval may be substantially reduced and performance of the device 100 (FIG. 1) substantially improved as described below.

FIG. 3A illustrates an embodiment of operations (blocks 304 through 332) performed by a storage device 100 (FIG. 1) employing boosted bitline voltages for storage cell programmed state verification in accordance with the present description. In this example, components of the device 100 including the storage cell programming logic 112, the programmed state verification logic 114 and the signal generator 116 of a storage die controller are configured to perform a programming pass which includes one or more programming loops (operations 308-324), in response to receipt (block 304, FIG. 3A) of a program command from a system component such as the transfer buffer 126, for example.

In response to a program command (block 304, FIG. 3A) to program one or more pages of write data to one or more target storage dies, storage cell programming logic 112 (FIG. 1) of the storage die controller associated with a target storage die applies (block 308, FIG. 3A) a program pulse to ramp up the voltage on a wordline, represented by wordline signal WLn, of a target storage cell which is to be programmed with write data in response to the program command. In one example, the target storage cell may be the storage cell 211 (FIG. 2) having an associated wordline 252 carrying wordline signal WLn=WL1. Thus, the wordline signal WL1 carried on wordline 252 includes a program pulse to program write data in the target storage cell 211.

In the illustrated embodiment, the storage cells are arranged in strings as described above in connection with FIG. 2 and indicated at 231, 232, 233 and 234. In this example, the target storage cell 211 is positioned in string 232 having an associated bitline 271 carrying bitline signal BL1 wherein the state of the bitline 271 is referred to herein as a target state bitline since the associated string 232 includes a target storage cell 211. In this example, the string 232 includes non-target storage cells which have already been successfully programmed and verified, or are not to be programmed in this loop. Accordingly, a pass pulse is applied (block 308, FIG. 3A) to each of the wordlines of the other (non-target) storage cells of the string 232 (FIG. 2) so that the non-target storage cells of the string 232 are not affected by programming or verification operations directed to the target storage cell 211 of the string 232.

Figure 4A:
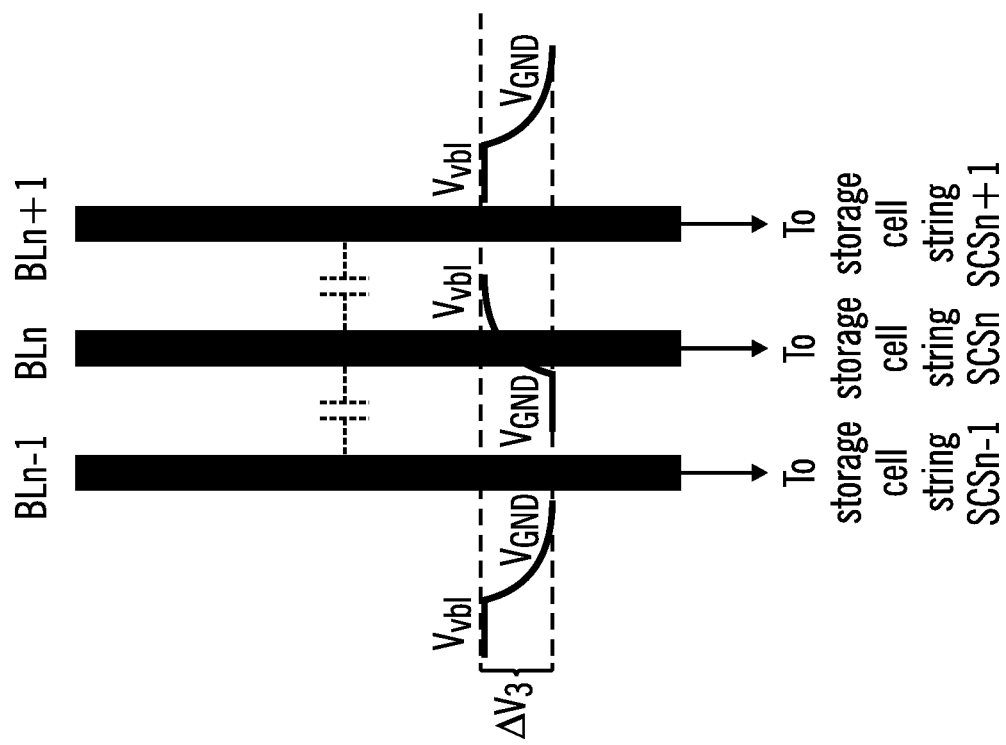
FIG. 4A illustrates voltage changes in a precharge subinterval employing boosted bitline voltages for program state verification in accordance with the present description.

After the program pulse is applied to the target storage cell of the string, a verification operation which includes a precharge subinterval and a verify sense subinterval, is directed to the target storage cell to verify the resultant program state of the target cell in response to the applied program pulse. In one aspect of boosted bitline voltages for storage cell programmed state verification in accordance with the present description, the voltage on the target state bitline of a string which includes a target storage cell, is ramped up (block 312, FIG. 3A) from a boosted non-target voltage $V_{boost}$ to the target state bitline verification voltage $V_{vbl}$ as shown in FIG. 4A for target state bitline carrying bitline signal BLn such as BLn=BL1 (FIG. 2) carried by bitline 271 in this example. The bitline carrying the bitline signal BLn is referred to herein simply by its bitline signal name BLn and is coupled to a storage cell string SCSn (such as string 232, FIG. 2, for example) as indicated in FIG. 4A. Similarly, the bitlines carrying the adjacent bitline signals BLn−1 and BLn+1, respectively, are referred to herein by the associated bitline signal names BLn−1 and BLn+1, and are coupled to associated storage cell strings SCSn−1 and SCSn+1 as indicated in FIG. 4A.

As best seen in FIG. 4A, the non-target state bitline voltage $V_{boost}$ is boosted by a $\Delta V_1=0.2V$, for example, with respect to the ground level as represented by $V_{GND}$. As a result, the magnitude of the ramp up in the precharge subinterval from the non-target bitline voltage $V_{boost}$ to the target state bitline verification voltage $V_{vbl}$, as represented by a boosted ramp up voltage change $\Delta V_2$, is reduced as compared to the ramp up change $\Delta V_3$ for a known device depicted in FIG. 4B.

FIG. 3B illustrates operations (blocks 354 through 382) performed by a known storage device employing known non-boosted bitline voltages for storage cell programmed state verification. Initially, in a manner similar to that of the device of FIG. 3A, in response to a program command (block 354, FIG. 3B) to program one or more pages of write data to one or more target storage dies, a program pulse is applied (block 358, FIG. 3B) to ramp up the voltage on a wordline of a target storage cell which is to be programmed with write data in response to the program command. In addition, a pass pulse is applied (block 358, FIG. 3B) to each of the wordlines of the other (non-target) storage cells of the string SCSn so that the non-target storage cells of the string SCSn are not affected by programming or verification operations directed to the target storage cell of the string SCSn.

Figure 4B:
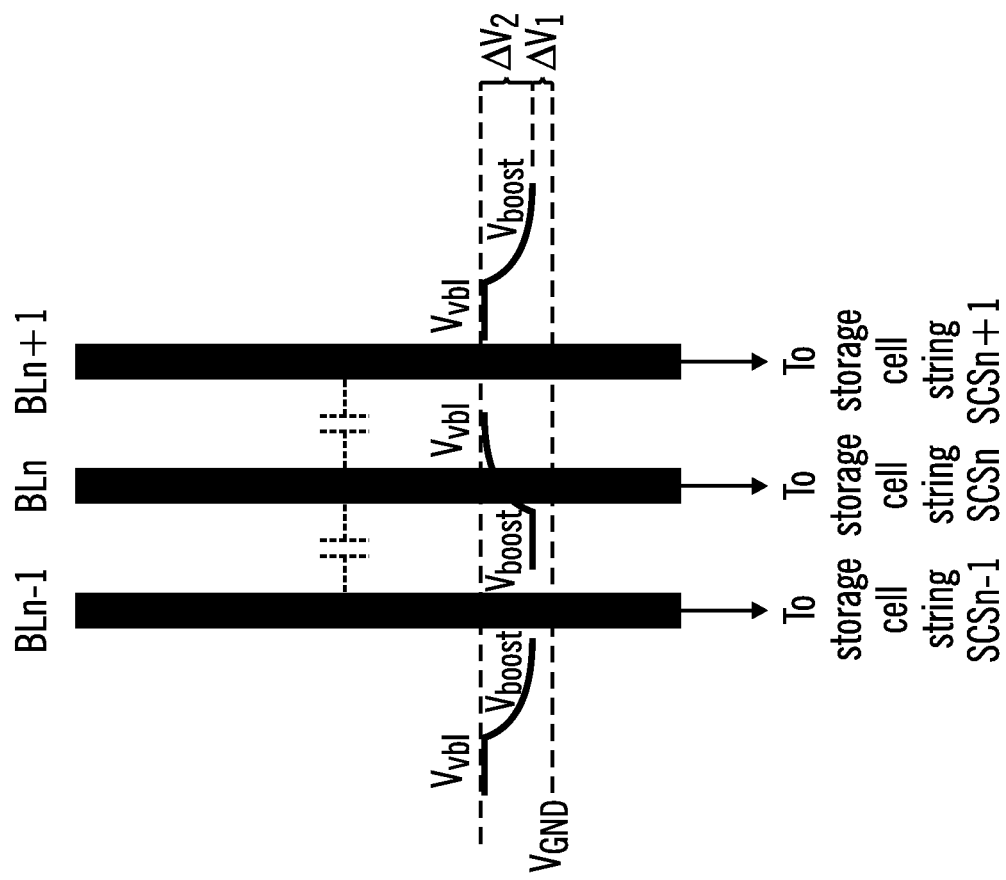
FIG. 4B illustrates voltage changes in a known precharge subinterval.

In contrast to the operations of FIG. 3A and the device of FIG. 4A, in a known precharge subinterval depicted in FIG. 4B, the voltage on the target state bitline of a string SCSn which includes a target storage cell, is ramped up (block 362, FIG. 3B) from a ground level bitline signal $V_{GND}$ (FIG. 4B) to the target state bitline verification voltage $V_{vbl}$, as shown in FIG. 4B for a target state bitline BLn. Comparing FIG. 4B to FIG. 4A, it is apparent that the non-target state bitline voltage $V_{GND}$ of FIG. 4B is not boosted but is instead at ground level $V_{GND}$. By comparison, $V_{boost}$ of FIG. 4A is boosted by a $\Delta V_1=0.2V$, for example, with respect to the ground level as represented by $V_{GND}$. As a result, in the known device of FIG. 4B, the magnitude of the ramp up in the known precharge interval of FIG. 4B from the non-target state bitline voltage $V_{GND}$ to the target state bitline verification voltage $V_{vbl}$, as represented by the known ramp up voltage change $\Delta V_3$ (FIG. 4B), is significantly larger than the magnitude change $\Delta V_2$ of the ramp up from the boosted non-target state bitline voltage $V_{boost}$ to the target state bitline verification voltage $V_{vbl}$, in the precharge interval for a device as depicted in FIG. 4A employing boosted bitline voltages for storage cell programmed state verification in accordance with the present description.

It is appreciated herein that the ramping up and down of voltages on adjacent bitlines activates strong bitline-to-bitline capacitive coupling (represented by bitline-to-bitline capacitors shown in phantom) which can significantly slow down the ramping up and settling of voltages at the level of the bitline verification voltage for target storage bitcells during the precharge subinterval of each programming interval. However, because the ramp up change $\Delta V_2$ (FIG. 4A) is significantly smaller than the ramp up change $\Delta V_3$ (FIG. 4B) of a known device, the bitline signal BLn can settle (block 320, FIG. 3A) to the target state bitline verification voltage $V_{vbl}$ much more quickly in a device employing boosted bitline voltages in accordance with the present description, as compared to a device which does not. Accordingly, the precharge subinterval may be substantially shortened using boosted bitline voltages, and the device performance substantially improved as a result.

Figure 5:
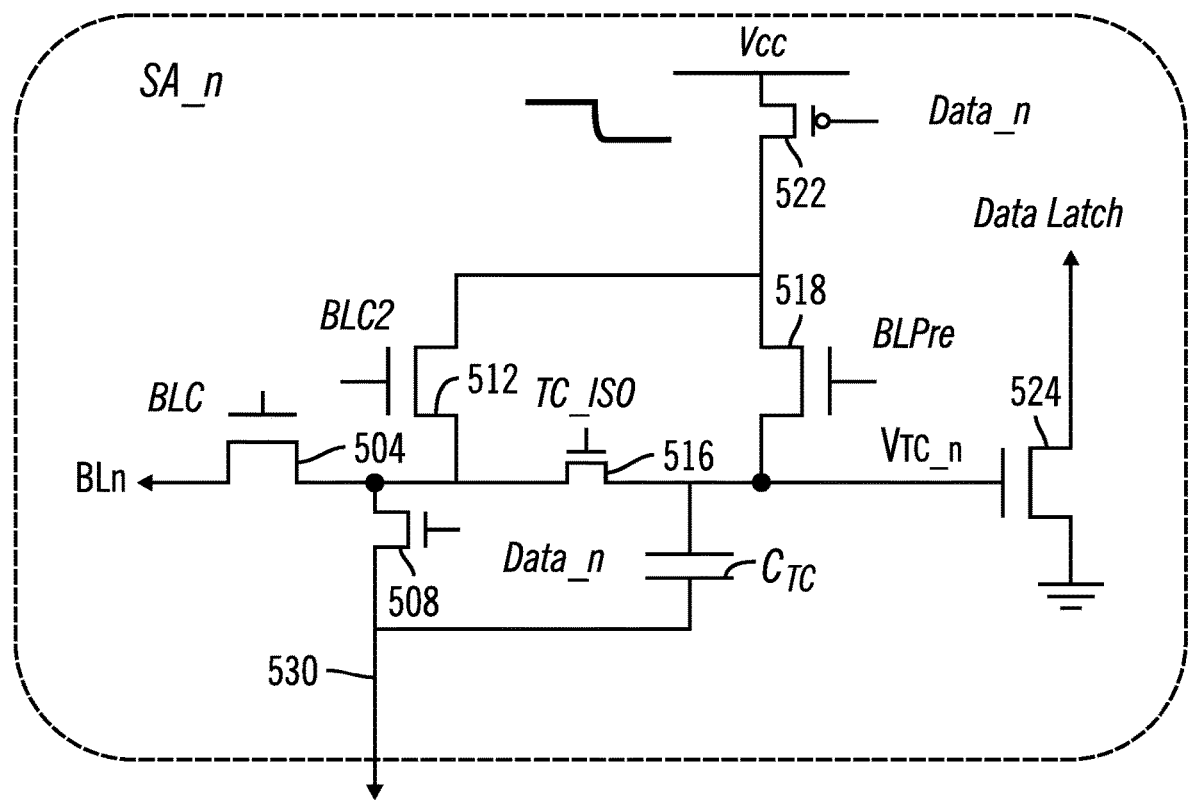
FIG. 5 illustrates an embodiment of a known sense amplifier for the storage device of FIG. 1.

FIG. 5 depicts an example of a known sense amplifier SA_n which precharges an associated bitline BLn for subsequent sensing and verification of the program state of a target storage cell of a target state string SCSn (FIG. 4A) of storage cells coupled to an associated bitline BLn. In this embodiment, the sense amplifier SA_n includes transistor components 504, 508, 512, 516, 518, 522 and 524, each of which has a source, drain, and control gate, and are controlled by control signals bitline clamp (BLC), BLC2, Data_n, TC_ISO, bitline precharge (BLPre), Data_n (inverted) and voltage TC ($V_{TC}$). The voltage $V_{TC}$ is maintained by a capacitor $C_{TC}$. As explained in greater detail below, the control signal Data_n controls whether the sense amplifier SA_n applies a target state bitline verification voltage to the associated bitline BLn, or applies a non-target state bitline voltage to the associated bitline BLn, during the precharge subinterval. The control signal Data_n may be generated by the signal generator 116 in one embodiment, or may be generated by other components of the memory controller 102 or storage dies $106_1, 106_2 \ldots 106_n$, depending upon the particular application. Other control signals for each sense amplifier SA_n may be generated in a similar manner.

FIG. 6A depicts an example of a timing diagram for a device employing boosted voltage bitlines in accordance with the present description. By comparison, FIG. 6B depicts an example of a timing diagram for a known device which does not employ boosted voltage bitlines in accordance with the present description. In these examples, a particular bitline BLn is initially in a non-target state as indicated by the signal Data_n initially being in a logical low state. Accordingly, the initial non-target state of the bitline BLn indicates that all the storage cells of the storage cell string SCSn (FIGS. 4A, 4B) associated with the bitline BLn are all non-target storage cells, that is, no cell of the string SCSn had been targeted for programming in the prior programming interval.

Figure 7A:
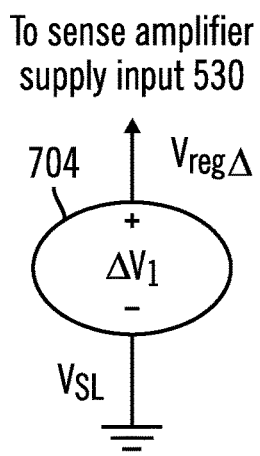
FIG. 7A illustrates a voltage regulator for boosting bitline voltages in a precharge subinterval employing boosted bitline voltages for program state verification in accordance with the present description.

The transistor 508 (FIG. 5) of the sense amplifier SA_n has a voltage supply input 530 which, in the example of FIG. 6A, is coupled to the output $V_{reg\Delta}$ of a voltage regulator 704 depicted in FIG. 7A. In one embodiment of a device employing boosted bitline voltage for programmed state verification in accordance with the present description, the voltage regulator 704 provides a non-zero offset or delta value, $\Delta V_1=0.2V$, for example, with respect to the string source line (SL) voltage $V_{SL}$ which is typically at ground ($V_{GND}=0V$), so that the voltage $V_{reg\Delta}$ at the voltage supply input 530 (FIG. 5) of the transistor 508 is boosted or offset from ground by the non-zero offset or delta value, $\Delta V_1=0.2V$, for example.

The logical low state of the control signal Data_n (FIG. 6A) in the non-target state of the bitline BLn, turns on the transistor 508 (FIG. 5) so that the in the non-target state of the bitline BLn, the boosted regulator output voltage $V_{reg\Delta}$ (FIG. 7A) is propagated to the input of the transistor 504 (FIG. 5) is which also turned on by the control signal BLC (FIG. 6A) in the non-target state of the bitline BLn. The bitline clamp (BLC) signal is maintained at a sufficiently high voltage (e.g. $V_{vbl}+V_{SL}$, for example) to turn on the transistor 504 for the verification operation. As a result, in the non-target state of the bitline BLn, the transistor 504 is adapted to couple the output of the voltage regulator 704 to the bitline BLn so that the boosted regulator output voltage $V_{reg\Delta}$ is propagated by the transistor 504 to the bitline BLn. Thus, the initial non-target state voltage $V_{boost}$ of the bitline BLn is boosted by the non-zero offset or delta value, $\Delta V_1=0.2V$, for example, as shown in FIG. 6A.

In this example, the bitline BLn, after an initial non-target state, is reclassified as a target state bitline. Accordingly, as shown in FIG. 6A, the control signal Data_n transitions from a logical low state to a logical high state. The subsequent target state of the bitline BLn indicates that a storage cell of the storage cell string SCSn (FIGS. 4A, 4B) associated with the bitline BLn is a target storage cell that had been targeted for verification. The transition of the Data_n signal for the bitline BLn from the logical low state to the logical high state, sets in motion the precharge interval as shown in FIG. 6A.

The logical high state of the control signal Data_n in the target state of the bitline BLn, turns off the transistor 508 so that the in the target state of the bitline BLn, the boosted regulator output voltage $V_{reg\Delta}$ is isolated from the bitline BLn. The logical low state of the control signal Data_n (inverted) in the target state of the bitline BLn, turns on the transistor 522 so that the in the target state of the bitline BLn, the bitline verification voltage $V_{vbl}$ is propagated to the bitline BLn. As a result, in the precharge subinterval of the target state of the bitline BLn, the voltage of the bitline BLn transitions from initial non-target state voltage $V_{boost}$ of the bitline BLn, to the target state bitline verification voltage $V_{vbl}$ which may be 0.7V, for example, as shown in FIG. 6A. Thus, in the embodiment of FIG. 6A, the minimum voltage of the bitline BLn over the course of the precharge subinterval is no lower than the voltage $V_{boost}$.

As described above, by boosting the non-target state bitline voltage by $\Delta V_1$ (FIGS. 4A, 7A) to $V_{boost}$, the change $\Delta V_2$ (FIG. 4A) from $V_{boost}$ of the non-target state to the target state bitline verification voltage $V_{vbl}$ is substantially reduced as compared to the change $\Delta V_3$ (FIG. 4B) over a precharge subinterval of a device which does not employ boosted bitline voltages as described herein. As a result, the bitline voltage can settle (block 320, FIG. 3A) more quickly to the bitline verification voltage Vvbl, to allow a substantial reduction in the duration of the precharge subinterval (such as 5 microseconds, for example) to provide a substantial improvement in device performance without sacrificing accuracy of the verify sensing operations of a verify sense subinterval following the precharge subinterval. Thus, at the end of the shortened precharge subinterval, the bitline voltages will be substantially settled notwithstanding the shortening of the duration of the precharge interval, and the program state of the target storage cell of the storage cell string associated with the bitline BLn may be safely sensed (block 324, FIG. 3A).

FIG. 6A depicts a verify sense subinterval following a precharge subinterval, in which the control signal $V_{TC\_n}$ controlling the latch transistor 524 either stays at the supply voltage $V_{CC}$ indicating a logic one (program state not yet verified) or drops to a lower value indicating a logic zero state (program state verified). If the programmed state of the target cell is verified to be have reached the intended level, the target cell may be reclassified as a non-target cell so inhibit any additional programming pulses or verification operations directed to that cell.

Figure 7B:
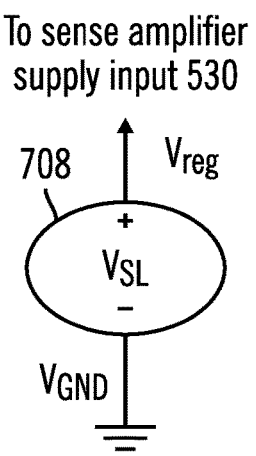
FIG. 7B illustrates a known voltage regulator for a known precharge subinterval for program state verification.

As noted above, FIG. 6B depicts an example of a timing diagram for a known device which does not employ boosted voltage bitlines for program state verification in accordance with the present description. For example, instead of employing the boosted voltage regulator 704 of FIG. 7A, a sense amplifier similar to the sense amplifier of FIG. 5 would have a supply input 530 coupled to a known, non-boosted voltage regulator such as the regulator 708 depicted in FIG. 7B. In this known example, the voltage regulator 708 provides at the output Vreg, the string source line (SL) voltage $V_{SL}$ which is typically ground ($V_{GND}=0V$). Thus, the regulator 708 does not provide a non-zero offset or delta value, $\Delta V_1=0.2V$, for example, with respect to the string source line (SL) voltage $V_{SL}$ which is typically at ground ($V_{GND}=0V$) As a result, the voltage at the voltage supply input 530 (FIG. 5) of the transistor 508 is $V_{reg}=V_{SL}=V_{GND}=0V$ for the known device of FIG. 6B.

In the non-target state of the bitline BLn of a known device, the non-boosted regulator output voltage $V_{reg}$ is propagated by the transistor 504 to the bitline BLn so that the initial non-target state voltage of the bitline BLn is grounded, that is, $V_{reg}=V_{SL}=V_{GND}=0V$, as shown in FIG. 6B. In the target state of the bitline BLn, the bitline verification voltage $V_{vbl}$ is propagated to the bitline BLn. As a result, in the precharge subinterval of the target state of the bitline BLn of a known device, the voltage of the bitline BLn transitions in the precharge subinterval from initial non-target state voltage $V_{SL}=V_{GND}=0V$ of the bitline BLn, to the target state bitline verification voltage $V_{vbl}$ which may be 0.7V, for example, as shown in FIG. 6B. Thus, in the known device of FIG. 6B, the minimum voltage of the bitline BLn over the course of the precharge subinterval is $V_{SL}=V_{GND}=0V$ instead of $V_{boost}$ (FIG. 6A) of a device employing boosted bitline voltages in accordance with the present description.

Lacking boosting of the non-target state bitline voltage by $\Delta V_1$ (FIGS. 4A, 6A) and thus lacking the boosted bitline voltage $V_{boost}$, the change $\Delta V_3$ (FIG. 4B) from $V_{GND}$ of the non-target state to the target state bitline verification voltage Vvbl is substantially larger as compared to the change $\Delta V_2$ (FIG. 4A) over a precharge subinterval of a device which does employ boosted bitline voltages as described herein. As a result, the bitline voltage will tend to settle (block 370, FIG. 3B) more slowly to the bitline verification voltage $V_{vbl}$ for the device of FIG. 6B, requiring a longer duration of the precharge subinterval (such as ten microseconds, for example) which can significantly impact device performance. Accordingly, the verify sense operation (block 374, FIG. 3B) is delayed by the longer precharge interval of the known device.

Adjacent to the bitline BLn in this example are the bitlines BLn+1 and BLn−1 (FIGS. 4A, 4B). In one example, the bitline signal BLn−1 may be BL0 (FIG. 2) carried by bitline 270 and the bitline signal BLn+1 may be BL2 (FIG. 2) carried by bitline 272. In the examples of FIGS. 4A-6B, bitlines BLn+1 and BLn−1 adjacent to the bitline BLn, are both initially in a target state as indicated by signals Data_n+1 and Data_n−1 (FIGS. 6A, 6B) each initially being in a logical high state and the voltages of the bitlines BLn+1 and BLn−1 each initially being at the bitline verification voltage $V_{VBL}$. Accordingly, the initial target state of the bitlines BLn+1 and BLn−1 indicates that a storage cell of each of the storage cell strings SCSn−1 (FIG. 4A), SCSn+1 associated with the bitlines BLn−1 and BLn+1, respectively, was a target storage cell in a prior programming and verification operation. The logical high state of the control signals Data_n−1 and Data_n+1 applied to sense amplifiers similar to the sense amplifier SAn (FIG. 5) for the bitline BLn, propagated the bitline verification voltage $V_{VBL}$ to the bitlines BLn+1 and BLn−1 in a manner similar to that described above in connection with the bitline BLn.

In this example, the bitlines BLn+1 and BLn−1 (FIGS. 4A, 4B, 6A, 6B), after an initial target state, are reclassified as non-target state bitlines. Accordingly, as shown in FIGS. 6A, 6B, the control signals Data_n−1 and Data_n+1 each transition from the logical high state to the logical low state. The reclassification of the bitlines BLn+1 and BLn−1 to a non-target state indicates that no storage cell of the storage cell strings SCSn-1, SCSn+1 (FIGS. 4A, 4B) associated with the bitlines BLn+1 and BLn−1 is a target storage cell that has been targeted for programming state verification in the next verification operation. The transition of the control signals Data_n−1 and Data_n+1 from the logical high state to the logical low state for the bitlines BLn+1 and BLn−1, respectively, sets in motion the precharge intervals for the bitlines BLn+1 and BLn−1 as shown in FIGS. 6A, 6B.

Returning to FIG. 3A which is directed to the storage device 100 employing boosted bitline voltages for storage cell programmed state verification in accordance with the present description, in response to the transition from logical high to logical low states of the control signals Data_n−1 and Data_n+1 (FIG. 6A) for the adjacent bitlines BLn−1 and BLn+1, respectively, the voltages on the reclassified non-target state bitlines BLn−1 and BLn+1 are each ramped down (block 316, FIG. 3A) from the target state bitline verification voltage $V_{vbl}$ as shown in FIG. 4A, FIG. 6A, to the boosted non-target voltage $V_{vbl}$. The logical low states of the control signals Data_n−1 and Data_n+1 propagate the boosted non-target voltage $V_{boost}$ the bitlines BLn+1 and BLn−1 in a manner similar to that described above in connection with the bitline BLn.

As noted above, the non-target state bitline voltage $V_{boost}$ is boosted by a $\Delta V_1=0.2V$, for example, with respect to the ground level as represented by $V_{GND}$. As a result, the magnitude of the ramp down (block 316) in the precharge subinterval from the target state bitline verification voltage $V_{vbl}$ to the non-target bitline voltage $V_{boost}$, as represented by a boosted ramp down voltage change $\Delta V_2$, is reduced as compared to the ramp down (block 366, FIG. 3B) change of $\Delta V_3$ for a known device depicted in FIGS. 4B, 6B.

As a result, the bitline voltage can settle (block 320, FIG. 3A) more quickly to the boosted bitline non-target voltage Vboost, to allow a substantial reduction in the duration of the precharge subinterval to provide a substantial improvement in device performance without sacrificing accuracy of the verify sensing operations of a verify sense subinterval following the precharge subinterval. Thus, at the end of the shortened precharge subinterval, the bitline voltages (FIG. 6A) will be substantially settled notwithstanding the shortening of the duration of the precharge interval, and the program state of the target storage cell of the storage cell string associated with the bitline BLn may be safely sensed (block 324, FIG. 3A). The boosted bitline non-target voltage Vboost is sufficiently small so as to prevent non-target storage cells of the non-target state bitlines BLn−1 and BLn+1 from inadvertently being activated in a verification process directed to target storage cells.

By comparison, referring again to FIG. 3B which is directed to operations of a known storage device employing known non-boosted bitline voltages for storage cell programmed state verification, in a known precharge subinterval depicted in FIGS. 4B, 6B, the voltages on the non-target state bitlines BLn−1, BLn+1 of strings SCSn−1, SCSn+1, respectively, are each ramped down (block 366, FIG. 3B) from the target state bitline verification voltage $V_{vbl}$ as shown in FIGS. 4B, 6B for non-target state bitlines BLn−1, BLn+1 to ground level bitline signal $V_{GND}$ (FIG. 4B), the voltage of the source line voltage $V_{SL}$ (FIG. 6B). As a result, in the known device of FIGS. 3B, 4B, 6B, the magnitude of the ramp down in the known precharge interval of FIGS. 4B, 6B from the target state bitline verification voltage $V_{vbl}$ to the non-target state bitline voltage $V_{SL}=V_{GND}=0.0V$, as represented by the known ramp down voltage change $\Delta V_3$ (FIG. 4B), is significantly larger than the magnitude of the ramp down change $\Delta V_2$ for a device as depicted in FIG. 4A employing boosted bitline voltages for storage cell programmed state verification in accordance with the present description. Thus, the bitline voltages for the adjacent bitlines BLn−1 and BLn+1 in a known device tend to settle (block 370, FIG. 3B) more slowly to the non-boosted bitline non-target voltage $V_{GND}$, so as to require a longer duration of the precharge subinterval before the verify sense operation (block 374, FIG. 3B) which can adversely affect device performance.

Once the bitline voltages have settled to their final voltage levels of the precharge subinterval, the programmed states of the target storage cells may be sensed (block 324 (FIG. 3A), 374 (FIG. 3B)) and reclassified as non-target storage cells if programming and verification are successful. If it is determined (blocks 328 (FIG. 3A), 378 (FIG. 3B)) that all programming loops have been completed, the programming in response to the program command ((block 304 (FIG. 3A), 354 (FIG. 3B)), is completed (block 332 (FIG. 3A), 3782 (FIG. 3B)). Conversely, if additional programming loops remain to be completed, the operations of blocks 308-324 (FIG. 3A) are repeated for the next programming level for a device employing boosted bitline voltages in accordance with the present description. For a known device not employing boosted bitline voltages, the operations of blocks 358-374 (FIG. 3A) are repeated for the next programming level until all levels are completed.

Figure 8:
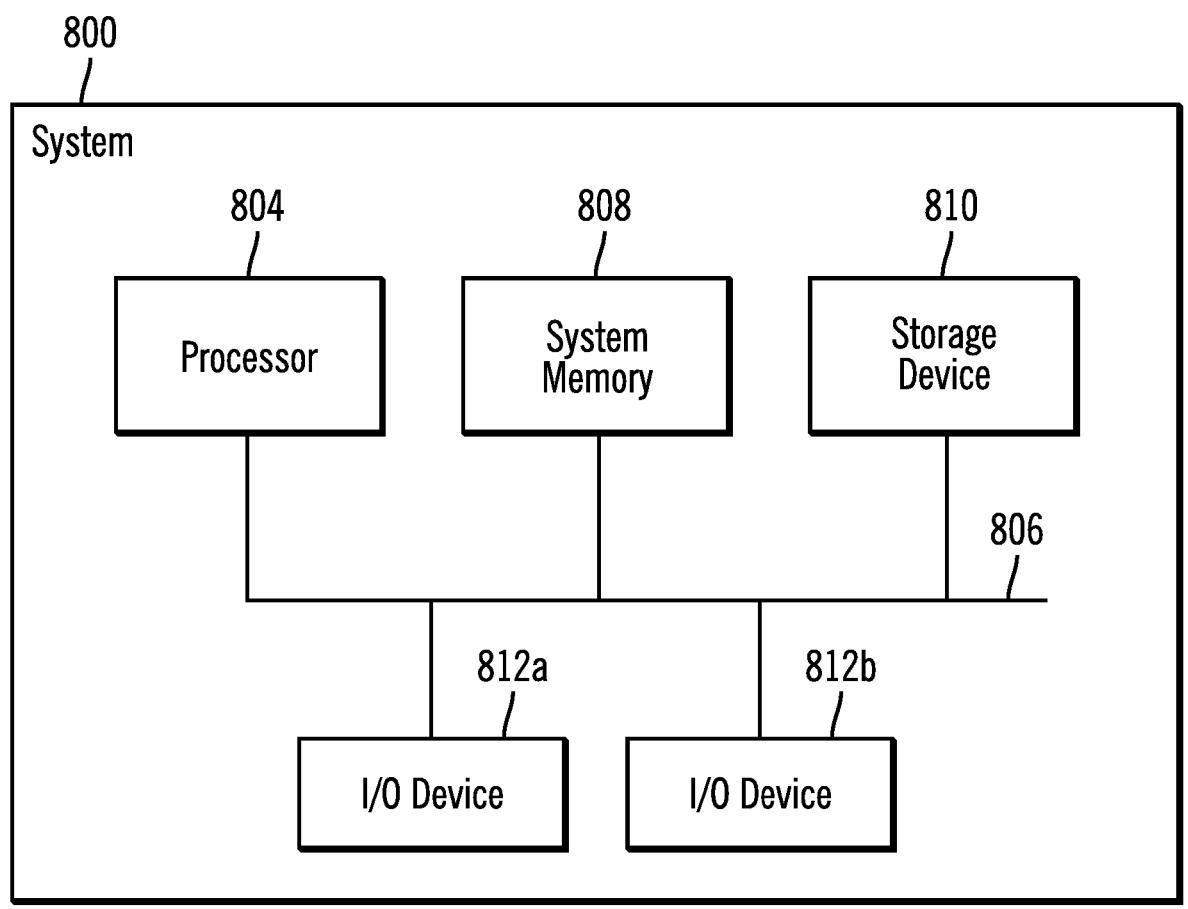
FIG. 8 illustrates an embodiment of a system which includes a non-volatile memory storage device employing boosted bitline voltages for program state verification in accordance with the present description.

FIG. 8 illustrates an embodiment of a system 800 in which the non-volatile memory storage device 100 may be deployed as the system memory device 808 and/or a storage device 810. The system 100 includes a processor 804 that communicates over a bus 806 with a system memory device 808 in which programs, operands and parameters being executed are cached, and a storage device 810, which may comprise a solid state drive (SSD) that stores programs and user data that may be loaded into the system memory 808 for execution. The processor 804 may also communicate with Input/Output (I/O) devices 812a, 812b, which may comprise input devices (e.g., keyboard, touchscreen, mouse, etc.), display devices, graphics cards, ports, network interfaces, battery, etc. The memory 808 and storage device 810 may be coupled to an interface on the system 800 motherboard, mounted on the system 800 motherboard, or deployed in an external memory device or accessible over a network.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

The reference characters used herein, such as i and n, etc., are used to denote a variable number of instances of an element, which may represent the same or different values, and may represent the same or different value when used with different or the same elements in different described instances.

Similarly, it should be appreciated that in the foregoing description of embodiments of the invention, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment. Thus, the claims following the detailed description are hereby expressly incorporated into this detailed description.

EXAMPLES

Example 1 is an apparatus for use with a memory array of storage cells having bitlines, comprising: a controller having logic configured to: classify storage cells of the memory array as one of target storage cells and non-target storage cells, apply programming pulses to program target storage cells to have programmed states, and verify programmed states of programmed target storage cells of the array including applying a bitline verification voltage to bitlines of programmed target storage cells and applying a non-zero bitline offset voltage to bitlines of non-target storage cells.

In Example 2, the subject matter of Examples 1-9 (excluding the present Example) can optionally include wherein classifying storage cells includes re-classifying programmed target storage cells having a verified programmed state as non-target storage cells.

In Example 3, the subject matter of Examples 1-9 (excluding the present Example) can optionally include wherein applying a bitline verification voltage to bitlines includes ramping from a non-zero bitline offset voltage previously applied to a first bitline of a non-target storage cell, to a bitline verification voltage applied to the first bitline of a target storage cell.

In Example 4, the subject matter of Examples 1-9 (excluding the present Example) can optionally include wherein applying a non-zero bitline offset voltage to bitlines includes ramping from a bitline verification voltage previously applied to a first bitline of a programmed target storage cell, to a non-zero bitline offset voltage applied to the first bitline of a target storage cell.

In Example 5, the subject matter of Examples 1-9 (excluding the present Example) can optionally include wherein verifying programmed states of programmed target storage cells includes allowing bitlines of programmed target storage cells to settle at a bitline verification voltage, allowing non-target storage cells to settle at a non-zero bitline offset voltage, and sensing programmed states of programmed target storage cells.

In Example 6, the subject matter of Examples 1-9 (excluding the present Example) can optionally include wherein the storage cells of the array are multiple level storage cells, the controller logic is further configured to: repeat for each level of the multiple level storage cells: classifying storage cells of the array as one of target storage cells and non-target storage cells, applying programming pulses to program target storage cells to have programmed states, and verifying programmed states of programmed target storage cells of the array.

In Example 7, the subject matter of Examples 1-9 (excluding the present Example) can optionally include wherein storage cells of the array are arranged in strings of storage cells including a first string of storage cells having a transistor source at one end, and a transistor drain at the other end and coupled to the first bitline, the controller further having a voltage supply and a sense amplifier having a transistor switch adapted to couple the voltage supply to the first bitline to ramp the voltage of the first bitline from the bitline verification voltage to the non-zero bitline offset voltage which is offset with respect to potential at the transistor source of the string.

In Example 8, the subject matter of Examples 1-9 (excluding the present Example) can optionally include wherein the non-volatile memory array comprises a three dimensional array of NAND storage cells.

In Example 9, the subject matter of Examples 1-9 (excluding the present Example) can optionally include a system, said system comprising: said controller and said memory array, and at least one of a display communicatively coupled to the controller, a network interface communicatively coupled to the controller, and a battery coupled to provide power to the system.

Example 10 is a method, comprising: classifying storage cells of a memory array as one of target storage cells and non-target storage cells, applying programming pulses to program target storage cells to have programmed states, and verifying programmed states of programmed target storage cells of the array including applying a bitline verification voltage to bitlines of programmed target storage cells and applying a non-zero bitline offset voltage to bitlines of non-target storage cells.

In Example 11, the subject matter of Examples 10-17 (excluding the present Example) can optionally include wherein classifying storage cells includes re-classifying programmed target storage cells having a verified programmed state as non-target storage cells.

In Example 12, the subject matter of Examples 10-17 (excluding the present Example) can optionally include wherein applying a bitline verification voltage to bitlines includes ramping from a non-zero bitline offset voltage previously applied to a first bitline of a non-target storage cell, to a bitline verification voltage applied to the first bitline of a target storage cell.

In Example 13, the subject matter of Examples 10-17 (excluding the present Example) can optionally include wherein applying a non-zero bitline offset voltage to bitlines includes ramping from a bitline verification voltage previously applied to a first bitline of a programmed target storage cell, to a non-zero bitline offset voltage applied to the first bitline of a target storage cell.

In Example 14, the subject matter of Examples 10-17 (excluding the present Example) can optionally include wherein verifying programmed states of programmed target storage cells includes allowing bitlines of programmed target storage cells to settle at a bitline verification voltage, allowing non-target storage cells to settle at a non-zero bitline offset voltage, and sensing programmed states of programmed target storage cells.

In Example 15, the subject matter of Examples 10-17 (excluding the present Example) can optionally include wherein the storage cells of the array are multiple level storage cells, the method further comprising repeating for each level of the multiple level storage cells: classifying storage cells of the array as one of target storage cells and non-target storage cells, applying programming pulses to program target storage cells to have programmed states, and verifying programmed states of programmed target storage cells of the array.

In Example 16, the subject matter of Examples 10-17 (excluding the present Example) can optionally include wherein storage cells of the array are arranged in strings of storage cells including a first string of storage cells having a transistor source at one end, and a transistor drain at the other end and coupled to the first bitline, the method further comprising switching a transistor switch to couple a voltage supply to the first bitline to ramp the voltage of the first bitline from the bitline verification voltage to the non-zero bitline offset voltage which is offset with respect to potential at the transistor source of the string.

In Example 17, the subject matter of Examples 10-17 (excluding the present Example) can optionally include wherein the non-volatile memory array comprises a three dimensional array of NAND storage cells.

Example 18 is an apparatus comprising means to perform a method as claimed in any preceding example.

Example 19 is a system, comprising: a memory array of storage cells having bitlines, and a controller having logic configured to: classify storage cells of the memory array as one of target storage cells and non-target storage cells, apply programming pulses to program target storage cells to have programmed states, and verify programmed states of programmed target storage cells of the array including applying a bitline verification voltage to bitlines of programmed target storage cells and applying a non-zero bitline offset voltage to bitlines of non-target storage cells.

In Example 20, the subject matter of Examples 19-27 (excluding the present Example) can optionally include wherein classifying storage cells includes re-classifying programmed target storage cells having a verified programmed state as non-target storage cells.

In Example 21, the subject matter of Examples 19-27 (excluding the present Example) can optionally include wherein applying a bitline verification voltage to bitlines includes ramping from a non-zero bitline offset voltage previously applied to a first bitline of a non-target storage cell, to a bitline verification voltage applied to the first bitline of a target storage cell.

In Example 22, the subject matter of Examples 19-27 (excluding the present Example) can optionally include wherein applying a non-zero bitline offset voltage to bitlines includes ramping from a bitline verification voltage previously applied to a first bitline of a programmed target storage cell, to a non-zero bitline offset voltage applied to the first bitline of a target storage cell.

In Example 23, the subject matter of Examples 19-27 (excluding the present Example) can optionally include wherein verifying programmed states of programmed target storage cells includes allowing bitlines of programmed target storage cells to settle at a bitline verification voltage, allowing non-target storage cells to settle at a non-zero bitline offset voltage, and sensing programmed states of programmed target storage cells.

In Example 24, the subject matter of Examples 19-27 (excluding the present Example) can optionally include wherein the storage cells of the array are multiple level storage cells, and the controller logic is further configured to: repeat for each level of the multiple level storage cells: classifying storage cells of the array as one of target storage cells and non-target storage cells, applying programming pulses to program target storage cells to have programmed states, and verifying programmed states of programmed target storage cells of the array.

In Example 25, the subject matter of Examples 19-27 (excluding the present Example) can optionally include wherein storage cells of the array are arranged in strings of storage cells including a first string of storage cells having a transistor source at one end, and a transistor drain at the other end and coupled to the first bitline, the controller further having a voltage supply and a sense amplifier having a transistor switch adapted to couple the voltage supply to the first bitline to ramp the voltage of the first bitline from the bitline verification voltage to the non-zero bitline offset voltage which is offset with respect to potential at the transistor source of the string.

In Example 26, the subject matter of Examples 19-27 (excluding the present Example) can optionally include wherein the non-volatile memory array comprises a three dimensional array of NAND storage cells.

In Example 27, the subject matter of Examples 19-27 (excluding the present Example) can optionally include at least one of: a display communicatively coupled to the controller, a network interface communicatively coupled to the controller, and a battery coupled to provide power to the system.

Example 28 is an apparatus for use with a memory array of storage cells having bitlines, comprising: a controller having logic means configured for: classifying storage cells of the memory array as one of target storage cells and non-target storage cells, applying programming pulses to program target storage cells to have programmed states, and verifying programmed states of programmed target storage cells of the array including applying a bitline verification voltage to bitlines of programmed target storage cells and applying a non-zero bitline offset voltage to bitlines of non-target storage cells.

In Example 29, the subject matter of Examples 28-36 (excluding the present Example) can optionally include wherein classifying storage cells includes re-classifying programmed target storage cells having a verified programmed state as non-target storage cells.

In Example 30, the subject matter of Examples 28-36 (excluding the present Example) can optionally include wherein applying a bitline verification voltage to bitlines includes ramping from a non-zero bitline offset voltage previously applied to a first bitline of a non-target storage cell, to a bitline verification voltage applied to the first bitline of a target storage cell.

In Example 31, the subject matter of Examples 28-36 (excluding the present Example) can optionally include wherein applying a non-zero bitline offset voltage to bitlines includes ramping from a bitline verification voltage previously applied to a first bitline of a programmed target storage cell, to a non-zero bitline offset voltage applied to the first bitline of a target storage cell.

In Example 32, the subject matter of Examples 28-36 (excluding the present Example) can optionally include wherein verifying programmed states of programmed target storage cells includes allowing bitlines of programmed target storage cells to settle at a bitline verification voltage, allowing non-target storage cells to settle at a non-zero bitline offset voltage, and sensing programmed states of programmed target storage cells.

In Example 33, the subject matter of Examples 28-36 (excluding the present Example) can optionally include wherein the storage cells of the array are multiple level storage cells, the controller logic means is further configured for: repeating for each level of the multiple level storage cells: classifying storage cells of the array as one of target storage cells and non-target storage cells, applying programming pulses to program target storage cells to have programmed states, and verifying programmed states of programmed target storage cells of the array.

In Example 34, the subject matter of Examples 28-36 (excluding the present Example) can optionally include wherein storage cells of the array are arranged in strings of storage cells including a first string of storage cells having a transistor source at one end, and a transistor drain at the other end and coupled to the first bitline, the controller further having a voltage supply and a sense amplifier having a transistor switch adapted to couple the voltage supply to the first bitline to ramp the voltage of the first bitline from the bitline verification voltage to the non-zero bitline offset voltage which is offset with respect to potential at the transistor source of the string.

In Example 35, the subject matter of Examples 28-36 (excluding the present Example) can optionally include wherein the non-volatile memory array comprises a three dimensional array of NAND storage cells.

In Example 36, the subject matter of Examples 28-36 (excluding the present Example) can optionally include a system, said system comprising: said controller and said memory array, and at least one of a display communicatively coupled to the controller, a network interface communicatively coupled to the controller, and a battery coupled to provide power to the system.

Example 37 is a computer program product for a computing system having a memory array of storage cells having bitlines, and a controller for controlling the memory array, wherein the computer program product comprises a computer readable storage medium having program instructions embodied therewith, the program instructions executable by a processor of the computing system to cause operations, the operations comprising: classifying storage cells of the memory array as one of target storage cells and non-target storage cells, applying programming pulses to program target storage cells to have programmed states, and verifying programmed states of programmed target storage cells of the array including applying a bitline verification voltage to bitlines of programmed target storage cells and applying a non-zero bitline offset voltage to bitlines of non-target storage cells.

In Example 38, the subject matter of Examples 37-45 (excluding the present Example) can optionally include wherein classifying storage cells includes re-classifying programmed target storage cells having a verified programmed state as non-target storage cells.

In Example 39, the subject matter of Examples 37-45 (excluding the present Example) can optionally include wherein applying a bitline verification voltage to bitlines includes ramping from a non-zero bitline offset voltage previously applied to a first bitline of a non-target storage cell, to a bitline verification voltage applied to the first bitline of a target storage cell.

In Example 40, the subject matter of Examples 37-45 (excluding the present Example) can optionally include wherein applying a non-zero bitline offset voltage to bitlines includes ramping from a bitline verification voltage previously applied to a first bitline of a programmed target storage cell, to a non-zero bitline offset voltage applied to the first bitline of a target storage cell.

In Example 41, the subject matter of Examples 37-45 (excluding the present Example) can optionally include wherein verifying programmed states of programmed target storage cells includes allowing bitlines of programmed target storage cells to settle at a bitline verification voltage, allowing non-target storage cells to settle at a non-zero bitline offset voltage, and sensing programmed states of programmed target storage cells.

In Example 42, the subject matter of Examples 37-45 (excluding the present Example) can optionally include wherein the storage cells of the array are multiple level storage cells, and the operations further include repeating for each level of the multiple level storage cells: classifying storage cells of the array as one of target storage cells and non-target storage cells, applying programming pulses to program target storage cells to have programmed states, and verifying programmed states of programmed target storage cells of the array.

In Example 43, the subject matter of Examples 37-45 (excluding the present Example) can optionally include wherein storage cells of the array are arranged in strings of storage cells including a first string of storage cells having a transistor source at one end, and a transistor drain at the other end and coupled to the first bitline, the controller further having a voltage supply and a sense amplifier having a transistor switch, the operations further including the transistor switch coupling the voltage supply to the first bitline to ramp the voltage of the first bitline from the bitline verification voltage to the non-zero bitline offset voltage which is offset with respect to potential at the transistor source of the string.

In Example 44, the subject matter of Examples 37-45 (excluding the present Example) can optionally include wherein the non-volatile memory array comprises a three dimensional array of NAND storage cells.

In Example 45, the subject matter of Examples 37-45 (excluding the present Example) can optionally include wherein the computing system includes at least one of a display communicatively coupled to the controller, a network interface communicatively coupled to the controller, and a battery coupled to provide power to the system.

All optional features of any of the systems and/or apparatus described above may also be implemented with respect to the method or process described above, and specifics in the examples may be used anywhere in one or more embodiments. Additionally, all optional features of the method or process described above may also be implemented with respect to any of the system and/or apparatus described above, and specifics in the examples may be used anywhere in one or more embodiments.

What is claimed:

1. An apparatus for use with a memory array of storage cells having bitlines, comprising:
a controller having logic configured to:
classify storage cells of the memory array as one of target storage cells and non-target storage cells;
apply programming pulses to program target storage cells to have programmed states; and
verify programmed states of programmed target storage cells of the array including applying a bitline verification voltage to bitlines of programmed target storage cells and applying a non-zero bitline offset voltage to bitlines of non-target storage cells.

2. The apparatus of claim 1 wherein classifying storage cells includes re-classifying programmed target storage cells having a verified programmed state as non-target storage cells.

3. The apparatus of claim 1 wherein applying a bitline verification voltage to bitlines includes ramping from a non-zero bitline offset voltage previously applied to a first bitline of a non-target storage cell, to a bitline verification voltage applied to the first bitline of a target storage cell.

4. The apparatus of claim 1 wherein applying a non-zero bitline offset voltage to bitlines includes ramping from a bitline verification voltage previously applied to a first bitline of a programmed target storage cell, to a non-zero bitline offset voltage applied to the first bitline of a target storage cell.

5. The apparatus of claim 1 wherein verifying programmed states of programmed target storage cells includes allowing bitlines of programmed target storage cells to settle at a bitline verification voltage, allowing non-target storage cells to settle at a non-zero bitline offset voltage, and sensing programmed states of programmed target storage cells.

6. The apparatus of claim 1 wherein the storage cells of the array are multiple level storage cells, the controller logic is further configured to:
repeat for each level of the multiple level storage cells:
classifying storage cells of the array as one of target storage cells and non-target storage cells;
applying programming pulses to program target storage cells to have programmed states; and
verifying programmed states of programmed target storage cells of the array.

7. The apparatus of claim 4 wherein storage cells of the array are arranged in strings of storage cells including a first string of storage cells having a transistor source at one end, and a transistor drain at the other end and coupled to the first bitline, the controller further having a voltage supply and a sense amplifier having a transistor switch adapted to couple the voltage supply to the first bitline to ramp the voltage of the first bitline from the bitline verification voltage to the non-zero bitline offset voltage which is offset with respect to potential at the transistor source of the string.

8. The apparatus of claim 1, wherein the non-volatile memory array comprises a three dimensional array of NAND storage cells.

9. A method, comprising:
classifying storage cells of a memory array as one of target storage cells and non-target storage cells;
applying programming pulses to program target storage cells to have programmed states; and
verifying programmed states of programmed target storage cells of the array including applying a bitline verification voltage to bitlines of programmed target storage cells and applying a non-zero bitline offset voltage to bitlines of non-target storage cells.

10. The method of claim 9 wherein classifying storage cells includes re-classifying programmed target storage cells having a verified programmed state as non-target storage cells.

11. The method of claim 9 wherein applying a bitline verification voltage to bitlines includes ramping from a non-zero bitline offset voltage previously applied to a first bitline of a non-target storage cell, to a bitline verification voltage applied to the first bitline of a target storage cell.

12. The method of claim 9 wherein applying a non-zero bitline offset voltage to bitlines includes ramping from a bitline verification voltage previously applied to a first bitline of a programmed target storage cell, to a non-zero bitline offset voltage applied to the first bitline of a target storage cell.

13. The method of claim 9 wherein verifying programmed states of programmed target storage cells includes allowing bitlines of programmed target storage cells to settle at a bitline verification voltage, allowing non-target storage cells to settle at a non-zero bitline offset voltage, and sensing programmed states of programmed target storage cells.

14. The method of claim 9 wherein the storage cells of the array are multiple level storage cells, the method further comprising repeating for each level of the multiple level storage cells:
classifying storage cells of the array as one of target storage cells and non-target storage cells;
applying programming pulses to program target storage cells to have programmed states; and
verifying programmed states of programmed target storage cells of the array.

15. The method of claim 12 wherein storage cells of the array are arranged in strings of storage cells including a first string of storage cells having a transistor source at one end, and a transistor drain at the other end and coupled to the first bitline, the method further comprising switching a transistor switch to couple a voltage supply to the first bitline to ramp the voltage of the first bitline from the bitline verification voltage to the non-zero bitline offset voltage which is offset with respect to potential at the transistor source of the string.

16. The method of claim 9, wherein the non-volatile memory array comprises a three dimensional array of NAND storage cells.

17. A system, comprising:
a memory array of storage cells having bitlines; and
a controller having logic configured to:
classify storage cells of the memory array as one of target storage cells and non-target storage cells;
apply programming pulses to program target storage cells to have programmed states; and
verify programmed states of programmed target storage cells of the array including applying a bitline verification voltage to bitlines of programmed target storage cells and applying a non-zero bitline offset voltage to bitlines of non-target storage cells.

18. The system of claim 17 wherein classifying storage cells includes re-classifying programmed target storage cells having a verified programmed state as non-target storage cells.

19. The system of claim 17 wherein applying a bitline verification voltage to bitlines includes ramping from a non-zero bitline offset voltage previously applied to a first bitline of a non-target storage cell, to a bitline verification voltage applied to the first bitline of a target storage cell.

20. The system of claim 17 wherein applying a non-zero bitline offset voltage to bitlines includes ramping from a bitline verification voltage previously applied to a first bitline of a programmed target storage cell, to a non-zero bitline offset voltage applied to the first bitline of a target storage cell.

21. The system of claim 17 wherein verifying programmed states of programmed target storage cells includes allowing bitlines of programmed target storage cells to settle at a bitline verification voltage, allowing non-target storage cells to settle at a non-zero bitline offset voltage, and sensing programmed states of programmed target storage cells.

22. The system of claim 17 wherein the storage cells of the array are multiple level storage cells, and the controller logic is further configured to:
repeat for each level of the multiple level storage cells:
classifying storage cells of the array as one of target storage cells and non-target storage cells;
applying programming pulses to program target storage cells to have programmed states; and
verifying programmed states of programmed target storage cells of the array.

23. The system of claim 20 wherein storage cells of the array are arranged in strings of storage cells including a first string of storage cells having a transistor source at one end, and a transistor drain at the other end and coupled to the first bitline, the controller further having a voltage supply and a sense amplifier having a transistor switch adapted to couple the voltage supply to the first bitline to ramp the voltage of the first bitline from the bitline verification voltage to the non-zero bitline offset voltage which is offset with respect to potential at the transistor source of the string.

24. The system of claim 17 wherein the non-volatile memory array comprises a three dimensional array of NAND storage cells.

* * * * *